United States Patent
Galyas

(10) Patent No.: US 7,203,637 B1
(45) Date of Patent: Apr. 10, 2007

(54) TRANSMISSION OF COMPRESSED INFORMATION WITH REAL TIME REQUIREMENT IN A PACKET ORIENTED INFORMATION NETWORK

(75) Inventor: Johan Karoly Peter Galyas, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 370 days.

(21) Appl. No.: 09/612,628

(22) Filed: Jul. 7, 2000

(30) Foreign Application Priority Data

Jul. 9, 1999 (SE) .................................. 9902655

(51) Int. Cl.
*G10L 19/00* (2006.01)

(52) U.S. Cl. .................... 704/201; 704/212; 704/229

(58) Field of Classification Search ............. 370/522, 370/335; 714/755, 786, 748, 774, 751; 704/201, 704/212, 229; 455/437
See application file for complete search history.

(56) References Cited

U.S. PATENT DOCUMENTS

| 4,903,301 | A | * | 2/1990 | Kondo et al. ............... 704/501 |
|---|---|---|---|---|
| 5,010,553 | A | | 4/1991 | Scheller et al. |
| 5,268,933 | A | | 12/1993 | Averbuch |
| 5,757,810 | A | * | 5/1998 | Fall ............................ 714/704 |
| 5,991,716 | A | * | 11/1999 | Lehtimaki ................... 704/212 |
| 6,205,130 | B1 | * | 3/2001 | DeJaco ........................ 370/335 |
| 6,230,120 | B1 | * | 5/2001 | Suvanen ..................... 704/201 |
| 6,295,302 | B1 | * | 9/2001 | Hellwig et al. ............. 370/522 |
| 6,385,451 | B1 | * | 5/2002 | Kalliokulju et al. ........ 455/437 |
| 6,470,470 | B2 | * | 10/2002 | Jarvinen et al. ............ 714/755 |
| 2003/0009325 | A1 | * | 1/2003 | Kirchherr et al. ........... 704/211 |

FOREIGN PATENT DOCUMENTS

| WO | 97/37466 | 10/1997 |
|---|---|---|
| WO | 99/11032 | 3/1999 |

* cited by examiner

*Primary Examiner*—Richemond Dorvil
*Assistant Examiner*—Lamont Spooner

(57) ABSTRACT

The present invention relates to packet-distributed data transmission of compressed data. According to the invention, parity bits are supplied to the compressed data. The parity bits are used in the entire transmission chain between an encoder having compressed the data, and a decoder which decompresses it. According to one embodiment, the data is speech and the packet-distributed network is a mobile radio network with packet-distribution in included links. However, sending in the radio link of the compressed speech is circuit switched.

9 Claims, 3 Drawing Sheets

TRANSMISSION OF COMPRESSED INFORMATION WITH REAL TIME REQUIREMENT IN A PACKET ORIENTED INFORMATION NETWORK

TECHNICAL FIELD

The present invention relates to electronic information transfer, in particular transmission of compressed data with real time requirement through at least one packet oriented transmission link.

STATE OF THE ART

In stationary telephone networks, speech between two users is usually transferred through PCM links. For a speech connection, PCM links give a transferring capacity of 64 kbits/sec in each direction. Speech in the form of acoustic sound is received by the microphone of the telephone, which microphone forms an analogue speech signal. The analogue speech signal is converted to a PCM-coded speech signal by the analogue speech signal being sampled at a rate of 8 kHz/sec, and each sample being quantified and given a binary representation. At this time the speech is converted to a bit stream of 64 kbits/sec.

In mobile radio networks, the speech is sent through a radio connection between a mobile station and a stationary base station in the mobile radio network to reach an opposite party.

The number of possible radio connections is limited by the size of the radio spectrum, i.e. band width, available to the mobile radio network. Since the available band width always is narrow, it has to be used extremely effectively. Therefore the transferring capacity of a radio link is considerably lower than 64 kbits/sec in most mobile radio networks. For example, GSM networks have a transferring capacity of 13 kbits/sec through the radio link for speech.

In order to make it possible to transfer speech with good quality on one channel with such a low band width, the speech is compressed. This takes place in a speech encoder which speech encodes an incoming non-compressed stream of speech, e.g. a PCM-coded speech stream. A corresponding speech stream comes out of the speech encoder, which speech stream has been compressed and therefore has a considerably lower band width than the incoming signal. In a receiving mobile station, the compressed speech is decoded, after which the original analogue signal is reproduced as a sound signal.

By means of speech encoders, it is, despite different band widths of radio links in the mobile network and PCM links in the stationary telephone network, possible to establish a speech connection between a stationary telephone and a mobile station, and obtain good speech quality for the connection.

The well known GSM system contains speech encoder units. They are centrally located in the stationary part of the network. They are usually located in a base station controller, though, alternatively, they can be located in connection to a mobile switching center. Such a speech encoder unit has a connection to a PCM link, i.e. a link to the stationary telephone network and the stationary telephone. The speech encoder unit also has a connection to a second link with a transferring capacity for speech of 13 kbits/sec. The second link leads to a base station with a radio connection to the mobile station. The second link has a duplex connection as well.

From the PCM link, the speech encoder unit receives a stream of 64 kbits/sec digitally converted speech. The incoming speech is compressed in the speech encoder unit. At the time of the speech encoding, i.e. at the time of the compression, a number of speech parameters are created, representing the original speech signal. One of the speech parameters represents the oral cavity and how the keynote in the speech is formed, and others represent harmonics. Periods of 20 msec of the incoming stream are encoded and formatted in a speech block. The speech block contains speech parameters and is sent through the second link. A stream of speech blocks are sent through the second link, with 20 msec intervals, to be received by the mobile station via the radio link. Subsequently the speech blocks are decoded in the mobile station, and by means of the speech parameters the speech is reproduced as speech to the user of the mobile station.

In the opposite direction, i.e. speech from the mobile station to the telephone in the stationary network, the analogically captured speech signal is sampled and quantified, at which time the speech signal is represented in digital form. Subsequently the digital signal is speech encoded, whereby speech blocks are obtained. This takes place in the mobile station. All mobile stations are equipped with a speech encoder and speech decoder, to be able to encode and decode speech blocks.

Speech blocks created in the mobile station are sent, through the radio link and the second link, to the speech encoder unit. In the speech encoder unit the speech blocks are decoded and subsequently sent in a PCM-encoded format through the PCM link to the telephone in the stationary network.

Each duplex circuit switched connection is handled by a corresponding speech encoder unit. In the base station controller a number of speech encoder units are provided, to be able to take care of a corresponding number of circuit switched connections.

From the base station controller to the base station, a transmission connection is provided, which is shared by the speech encoders. The transmission connection is shared by different connection links on a time slot basis. The second link described above is one of these connection links. The connection links have a standardized interface called Abis and each has a capacity for transferring speech blocks of 13 kbits/sec.

To be sent through the Abis interface, a speech block is formatted in a speech frame. Besides the speech block, the speech frame contains some control bits so that the speech frame can be received correctly in the base station. The creation of the speech frame is parallel to the creation of the speech block in the speech encoder. Also the sending of the speech frame is commenced before the entire speech block is completed in the speech encoder. The information in the speech frame is divided into four partial periods of 5 msec each. At the time of the speech encoding, speech parameters that are valid for the entire period and speech parameters that are valid for the partial periods are created. When the speech frame is sent from the speech encoder unit through the second link, speech parameters are grouped together for the respective partial period, in such a way that speech parameters valid for the first partial period are sent first and speech parameters valid for the last partial period are sent last.

The speech frame is received by the base station and the speech parameters are read. When the entire speech frame has been received in the base station, the order in the speech block is re-sorted. Described in a somewhat simplified way, this takes place by the speech parameters having been graded as most important are grouped together, independently of which partial period they originate from. Thereafter these speech parameters are supplied with error-discovering encoding.

Additionally, channel encoding in the form of convolution-coding with Tail-Bits are supplied to the most important bits in the speech frame, before it is sent through the radio link. The less important bits remain uncoded. Thereafter the speech frame is interleaved.

By listening tests the importance of the speech parameters in the speech frame has been evaluated. This has taken place in such a way that the listeners have had the opportunity to evaluate the quality of speech decoded after an error having been inserted in one of the speech parameters. Errors in certain speech parameters have then appeared to lead to more severe quality disturbances than errors in other speech parameters. Each speech parameter is represented by a plurality of bits. The bits have different significance, i.e. a bit corresponding to a value of $2^2$ is more important than a bit corresponding to a value of $2^0$. The importance of all bits included in a speech frame has been graded. The grading is based upon the importance of the corresponding speech parameter combined with the significance of each bit. GSM 05.03 version 6.1.2 Table 2 states the grading for bits in speech blocks created with encoding according to Full-Rate.

The radio connection between the mobile station and the base station is subjected to interference. As a result, some data is corrupted during the transmission. Errors in the most important speech parameters are discovered with the aid of the error-discovering encoding and can be corrected to some degree. Errors in less important speech parameters escape discovery.

The technology for speech encoding is developing. As a result of this, the speech encoder units produced today are considerably better than the ones available when the GSM system was initiated. The first speech encoder unit that was standardized and used for the GSM system is called "Full-Rate". Two other speech encoders have been created later. One of these uses only half the bit rate of the Full-Rate encoder through the radio interface and is therefore called Half-Rate encoder. The other one uses the same bit rate as the Full-Rate encoder through the radio interface but gives a better speech quality and is called Enhanced-Full-Rate encoder. These three types of speech encoders are used at the same time in the GSM system. Different types of speech encoders are built into different mobile stations. Therefore, a speech encoder unit must be able to handle all types of speech encoders.

A base station reorganizes speech parameters and supplies the most important ones with error-discovering encoding in different ways for different types of speech encoding.

In the patent application WO 97/37466 it is suggested that, instead of standardized interfaces between nodes in the stationary part of the mobile radio network, packet-based transmission is used. In WO 97/37466, an ATM (Asynchronous Transfer Mode) network is suggested for transferring packet data between the nodes. A problem that WO 97/37466 attempts to solve is that the size of the ATM cells, i.e. the packets that transfer data through the ATM network, is poorly adapted to the a size of the speech frames.

One advantage of using packet-based transmission, as in WO 97/37466, is that statistical multiplexing can be used to make the transmission through participating links more effective.

To make the transmission more effective, packet-based transmission is used in combination with, for example VAD (Voice Activity Detection) and DTX (Discontinuous Transmission). VAD and DTX means that nothing is sent through a speech connection during pauses in the speech. By using packet-based transmission, instead of the standardized Abis interface, on the link between the base station controller and the base station in a GSM network, and by using DTX and VAD, the link can be used by more connections than before. A concept for this improved effectiveness is statistical multiplexing. This refers to that a certain transmission capacity can be uti-lized in a more effective way, since it can be shared between different users in a flexible way.

There are a number of protocols used for packet-oriented transmission. One protocol that is becoming more usual is the IP (Internet Protocol). According to IP, an IP packet is created for transferring a message. The IP packet is provided with an IP header, which contains information for connectivity between two end points.

On top of IP a further protocol is used, e.g. TCP (Transmission Control Protocol) or UDP (User Datagram Protocol). For real time services the UDP is most common. UDP handles the connectivity between the application at two end points. UDP creates a UDP message with a UDP header. The UDP header states the gateway number at the end points, and this gateway number corresponds to a certain application.

For transmission between transmission nodes, functions are divided into layers supported by a corresponding number of protocols. The relation between the protocols is usually indicated by a protocol stack. Under the IP protocol there are further layers of protocols with different alternatives, e.g. PPP (Point to Point Protocol) which uses HDLC (High Level Data Link Control), ATM or Frame Relay. The layers under IP creates packets with accompanying headers as well, done by, for example, HDLC.

Real time services means services in which a user interactively takes part in services and in which transmission delay must be experienced as negligible by the user. A telephone call is a typical real time service, and a video conference with sound and image is another one.

Packet-oriented transmission and IP are basically formed for transmission of traditional data traffic. Such data traffic usually endures delays, but is sensitive to error-detection of the data.

Since it has become interesting to use packet-oriented transmission for real time services, work is carried out to standardize QoS (Quality of Service). This includes giving different types of priority to different types of services, in packet-oriented transmission. For example, a real time service obtains a high priority for delay and a low priority for loss, while this relationship is the opposite for a data service. Said in a simplified manner, this will take place by giving each packet a label stating according to which priority the packet is to be processed in the transmission.

There are a number of difficulties to meet the requirements of QoS. At the occurrence of an error detection in a packet, the packet is usually thrown away. In the header of a message in the HDLC layer and in a UDP header, a check sum is contained to be able to discover an error detection. If an error is discovered, the whole packet is thrown away. Currently there is no possibility of knowing where in the packet is located. Though an error discovery in the HDLC layer may be ignored and the function for error discovery in the UDP may be closed, there is, in connection thereto, a risk that an important error, e.g. an error in the address in one of the protocol layers outside HDLC, is not discovered. In turn, this can result in further large errors in the communication, not only in the channel belonging to the connection but also in other channels.

The UDP header also contains a check sum, apart from gateway addresses. At the reception of the message at the end point, the UDP layer compares the content of the message with the check sum. If the content has been changed, this is discovered during the comparison. Where in the message the error resides remains unknown.

IETF (Internet Engineering Task Force) is an organization which standardizes the Internet. In a proposal to the IETF, (Larzon, Degermark and Pink) a modification of the UDP is suggested. The modification is called UDP Lite and means that the check sum in the UDP header covers the UDP header only or, alternatively, the UDP header together with a limited part of the user data that the UDP message is transferring. Thereby, during an error discovery, it is possible to know in which part of the message the error resides. But it is still not possible to know if the error resides in the UDP header or in the user data, if the check sum acts upon both of them.

PRESENTATION OF THE INVENTION

The data being compressed in an encoder, and sent in real time through a packet-oriented transmission chain to a decoder, where it is decompressed, is from time to time erroneously detected in some node in the transmission chain. The present invention addresses the problem of being able to well reproduce the compressed data in the decoder, even if the compressed data is erroneously detected in some node in the transmission chain.

One object of the present invention is to simplify the processing of compressed data in nodes present in the transmission chain.

In short, the invention suggests that even if the compressed data is distorted during the transmission from the encoder to the decoder, it will be sent to the decoder anyway. The decoder decides how the distortion is to be fixed.

The problem stated above is solved according to the invention with a method in which parity bits are supplied to the compressed data in the encoder and sent with the encoded data through the entire transmission chain to the decoder. In the decoder the parity bits are compared to the encoded data, whereby any errors are discovered. The data is decompressed in the decoder and in case an error is discovered, any error will be hidden during the encoding.

The problem is also solved by an encoder unit, which compresses a data stream by creating parameters representing the data in the stream. The parameters are divided into data blocks and the position of the parameters within data blocks is sorted according to the importance of the parameters in relation to each other. The data block is supplied with parity bits so that errors in the transmission can be discovered. As an alternative to sorting the positions of the parameters in the data block, the positions of the bits representing the parameters are sorted according to the importance of the bits.

A decoder, e.g. a mobile station, is already to this day provided with good means to hide discovered errors when received compressed data is decompressed. However, the errors discovered in the station are only errors caused in a radio link to the mobile station. The invention has the advantage that the means of the decoder to hide errors can be used also for errors that have arisen in other transmission links than radio links.

The invention also has the advantage that nodes that take care of the transmission of the compressed data do not need to know how data is compressed, to process the data correctly. Thereby, introducing new types of speech encoding becomes considerably easier. For example, the speech encoder units need to be changed only in case new types of speech encoders are inserted in mobile stations. The speech encoder units are present in fewer nodes than the base stations and, therefore, they are easier to upgrade.

The invention will now be described closer with the aid of preferred embodiments and with reference to the accompanying drawing.

FIGURE DESCRIPTION

FIG. 1*a* shows a previously known block diagrams of nodes for establishing a speech connection between a mobile station and a telephone in a stationary telephone network;

FIG. 1*b* shows a block diagram of nodes for establishing a speech connection between a mobile station and a telephone in a stationary telephone network utilizing packet-oriented transmission, according to a preferred embodiment of the invention;

FIG. 2 shows a diagram of the format for a previously known speech frame, formatted for the Abis interface.

FIG. 3*a* shows a previously known diagram of speech parameters in a speech frame, sorted according to importance.

FIG. 3*b* shows a previously known diagram of the same speech parameters as in FIG. 3*a*, after error-detecting encoding has been supplied to some of the speech parameters.

FIG. 3*c* shows a previously known diagram of the same speech parameters as in FIG. 3*b*, after a further reorganization of the speech parameters and supply of further tail bits.

FIG. 3*d* shows a previously known format for the speech parameters in FIG. 3*c*, after a convolution code has been supplied to some of the speech parameters.

PREFERRED EMBODIMENTS

First technical conditions are described, necessary for understanding the invention.

Figure 1A:
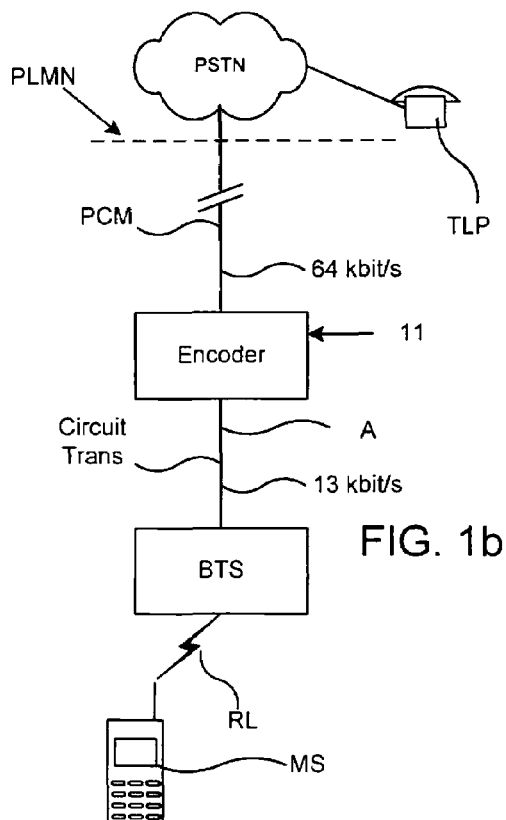

FIG. 1*a* shows a mobile station MS in a mobile radio network PLMN. The mobile radio network PLMN in FIG. 1*a* is a GSM network. A speech connection is established between the mobile station MS and a telephone TLP in a stationary public telephone network PSTN. The call is connected via a base station BTS and a speech encoder unit 11 (Transcoder and Rate Adaptor Unit) in the GSM network 11 to the stationary telephone network PSTN. Although more nodes are participating in the GSM network PLMN, FIG. 1*a* shows only the ones that are of interest to the invention. However, the nodes and interfaces shown in FIG. 1*a* are previously known. The speech encoder 11 is implemented in a base station controller.

Between the telephone TLP in the stationary network PSTN and the speech encoder unit 11 the call is transferred through a PCM link. The PCM link transfers the call in the form of quantified samples, produced with a sampling frequency of 8 kHz. This gives a speech stream of 64 kbits/sec to be transferred to the PCM link. 64 kbits/sec is the capacity usually used for connecting calls between telephones TLP in the stationary network PSTN.

The call is transferred between the mobile station MS and the base station BTS through a radio connection RL and between the base station BTS and the speech encoder unit 11 through a stationary link A, with an Abis interface, hereafter referred to as the Abis link A. The radio link RL and the Abis link A have a transferring capacity of 13 kbits/sec for speech.

In the speech encoder unit 11, an incoming speech stream of 64 kbits/sec from the telephone TLP is compressed. From the speech encoder comes a corresponding stream of speech, but at a rate of 13 kbits/sec. The compressed speech stream is sent over the Abis link A and radio link RL to the mobile station MS. In the station MS the speech is decoded and converted to sound.

Speech captured as sound in the station MS, and which is to be sent to the telephone TLP, is registered by a microphone, whereby an analogue signal is formed. The analogue speech signal is sampled and quantified, whereby a digital speech stream is obtained. The digital speech stream is encoded in the station MS, in the same manner as in the speech encoder unit 11, and sent through the radio link RL and the Abis link 12 to the speech encoder unit 11. The speech is decoded in the speech encoder unit and sent as a stream of sampled speech at 64 kbits/sec through the PCM link 13 to the telephone TLP.

Figure 3A:
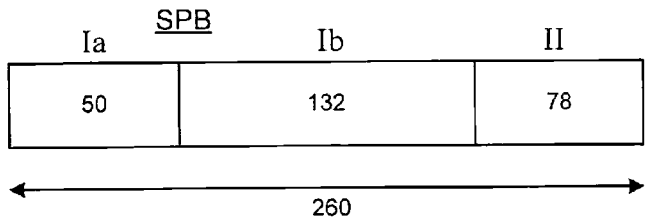

A stream of incoming speech from the PCM link to the speech encoder unit 11 is divided into periods of 20 msec. For each 20 msec period the speech encoder unit 11 forms a speech block SPB containing a number of speech parameters representing the speech. FIG. 3a shows a speech block SPB obtained through speech encoding according to "Full-Rate". The speech block SPB contains 260 bits representing the speech parameters. Each parameter is represented by at least two bits. The bits corresponds to the nominal values $2^0$, $2^1$, $2^2$, and so on, where the bit corresponding to $2^2$ has a higher significance than the bit representing $2^0$. Through a listening test, the importance of the different speech parameters has been given a subjective estimation. In the specification GSM 05.05 version 6.1.2 Table 2, the importance of each bit in the speech frame is graded. The grading is based on the importance of the corresponding speech parameters and the significance of the bit. The bits are divided into a class I and a class II, where class I means that a bit is more important than a class II bit. Within class I there are two groups, Ia and Ib, where group Ia is more important than Ib. According to Full-Rate encoding the group Ia comprises 50 bits, group Ib 135 bits and class II 78 bits.

In FIG. 3a the positions of the bits in the speech block SPB are sorted according to importance, with group Ia first in the speech block SPB, and after that the bits with group Ib and last the bits belonging to group/class II. However, in the speech encoder unit 11 the bits in the speech block SPB are not sorted according to their importance, rather the sorting takes place later when the speech block SPB has been sent to the base station BTS.

Figure 2:
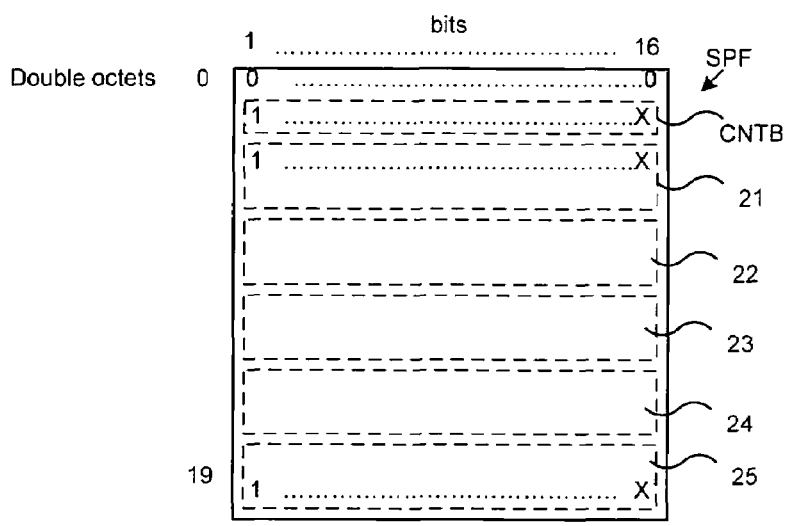

Before the speech block SPB is sent to the base station BTS, it is formatted and supplied with control/check bits, whereby a speech frame SPF is formed. The speech frame SPF is shown in FIG. 2. The speech frame SPF comprises 20 double octets, each corresponding to a row/line in the speech frame SPF. Each double octet contains 16 bits. The first double octet in the speech frame consists of zeros and the first bit in the rest of the double octet is constituted by a one. A following double octet CNTB contains check bits. This is also described in GSM 08.60 version 5.1.1, February 1998. The following double octets in the speech frame SPF are referred to five groups 21–25, indicated in FIG. 2 within broken lines.

The first group 21 of double octets is used for representing a group of speech parameters valid for the entire 20 msec period. The four following groups 22–25 of double octets are used for representing speech parameters valid for four corresponding partial periods of 5 msec out of the total period of 20 msec. Thus, the second group 22 contains speech parameters valid for a first partial period of 5 msec out of the total 20 msec, and the following group 23 represents speech parameters valid for the second partial period of 5 msec, etc.

The data of the speech blocks SPB corresponds to a bit rate of 13 kbits/sec through the Abis link A. However, the data of the speech frames SPF corresponds to a higher bit rate 16 kbits/sec through the Abis link A.

The speech frame SPF is created simultaneously to the creation of the speech block SPB, and therefore it is necessary for the speech parameters to be sorted in chronological order. The sending of the speech frame SPF commences before the entire speech frame SPF is completed. The reason for this is that the sending capacity of 13 kbits/sec of the Abis link A is to be utilized as effectively as possible to avoid delay.

Figure 3B:
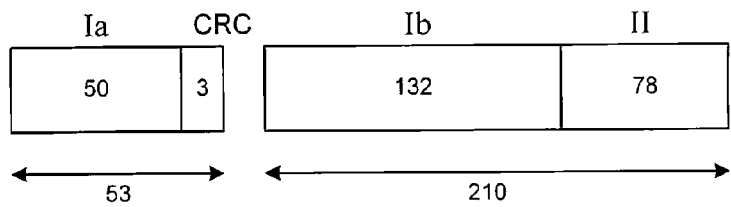

When the entire speech frame SPF has been received by the base station BTS, the speech parameters are read from the speech frame SPF, and the positions of the bits in the speech block SPB are sorted according to their importance. Thereby the order shown in FIG. 3a is obtained. To be able to discover any case of the speech parameters belonging to group 1a being received erroneously at the station MS after the radio transmission, three parity bits CRC are supplied to the bits in the speech frame SPF corresponding to speech parameters in group 1a, see FIG. 3b. The parity bits CRC are supplied according to the principle of error discovery according the cyclic encoding "cyclic redundancy check". This cyclic encoding is a block code.

Figure 3C:
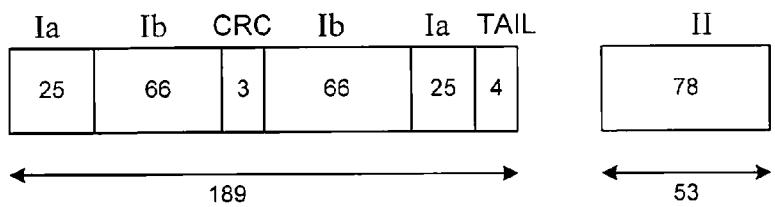
Figure 3D:
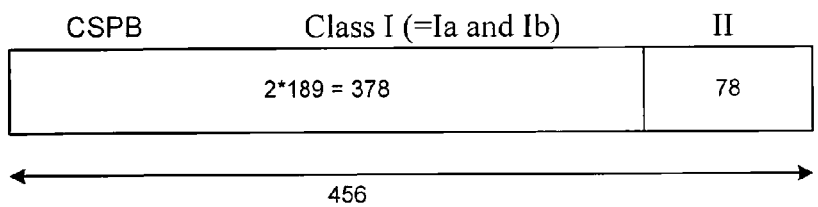

Thereafter, the speech parameters according to Class I are re-sorted again and provided with four tail-bits TAIL, see FIG. 3c. The speech parameters in Class I convolution-coded, whereby the number of bits is increased from 189 bits to 378. The convolution code makes it possible to correct a limited number of errors in the class I bits after receipt in the station MS. Certain positions are better protected than others by the convolution code and during the re-sorting the most important speech parameters are placed in the best protected positions. After the 378 Class I bits, the 78 bits representing speech parameters of Class II are placed, without error discovering encoding. FIG. 3d shows the coded speech block CSPB, which at the time comprises 456 bits. Thereby the coding of the speech block CSPB in FIG. 3d is completed in the base station BTS.

Before the coded speech block CSPB is sent through the radio link RL it is interleaved, i.e. divided to be sent in a number of TDMA bursts to the station MS.

Figure 1B:
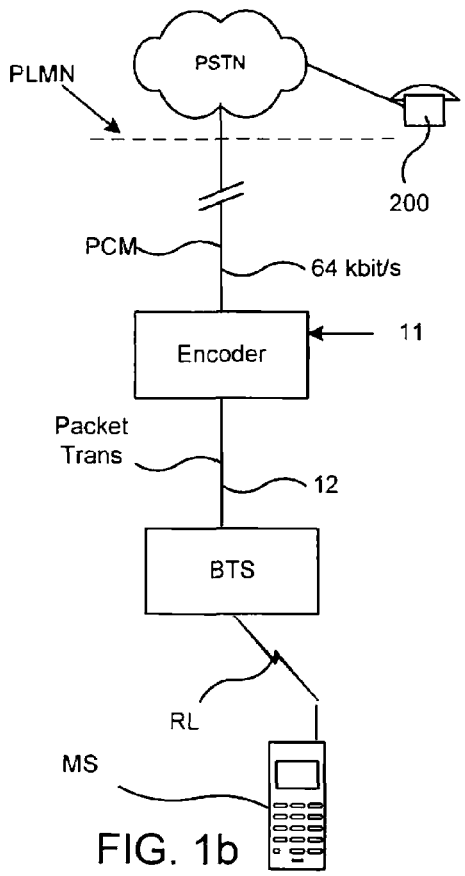

Described above are previously known functions in the GSM network PLMN, facilitating the understanding of the invention. A prerequisite for the invention is that a packet-oriented transmission is used through the stationary link between the speech encoder unit 11 and the base station BTS instead of a circuit-oriented transmission. The Abis interface implies a circuit-oriented transmission. The link previously called the Abis link A, with reference to FIG. 1a, will hereafter be called the stationary link 12. In the following, reference is made to FIG. 1b. The difference between FIGS. 1a and 1b is that in FIG. 1a, a circuit-oriented transmission between the speech encoder 11 and the base station BTS, while in FIG. 1b a packet-oriented transmission is used over the same link.

According to the invention the speech block SPB is supplied with error-discovering encoding in the speech encoder unit 11 instead of in the base station BTS. The error-discovering encoding is thereafter used during transmission through the stationary link 12 and through the radio link RL. Therefore, when the speech block is received by the mobile station MS, errors can be discovered regardless of whether they have arisen during the transmission through the stationary link 12 or through the radio link RL. In the uplink, the mobile station MS supplies a created speech block SPB with error-discovering encoding and sends it through the radio link RL. According to the invention, the speech block SPB is sent on through the stationary link 12 to the speech encoder unit 11 with the error-discovering encoding left.

For speech encoding according to "Full-Rate", the speech encoder unit 11 sorts the positions of the speech parameters in the speech block SPB according to their importance so that the order shown in FIG. 3a is obtained. Thereafter, the 50 bits in Class Ia are provided with three parity bits according to "cyclic redundancy check". With these three parity bits CRC, which constitutes encoding for error discovery, the speech block SPB comprises 263 bits.

The encoded speech block SPB with the 263 bits is provided with check bits, at which a speech frame SPF is formed. The speech frame SPF is sent to the base station BTS. The speech frame SPF does not have the same format as the speech frame sent over the Abis link A, rather, in principle, it has the same format as the speech block in FIG. 3c, supplied with further check bits. The check bits states what type of coding is used, etc, in order for the base station BTS and the decoder in the mobile station to be able to process the speech block SPB correctly. In the base station, the speech block SPB with the 263 bits is read, and the Class I bits are re-sorted, and error-correcting convolution coding is supplied in the manner described above in connection with FIGS. 3c and 3d. At this time, the speech block SPB comprises 456 bits. The 456 bits are interleaved and sent in a plurality of TDMA bursts to the mobile station MS.

When packet-based transmission is used, the speech encoder unit 11 creates the entire speech block SPB for the period of 20 msec, before the speech block SPB is sent through the stationary link 12. This makes it possible for the speech encoder unit to sort the position of the speech parameters in the speech block SPB according to their importance.

The embodiments presented above show how coding is supplied to a speech block created by speech encoding according to "Full-Rate". Speech blocks SPB created by speech encoding according to "Half-Rate" and "Enhanced Full-Rate" takes place in a similar manner. This means that the positions of the speech parameters in the speech block SPB are sorted according to importance. Thereafter, the important speech parameters are provided with parity bits CRC according to "cyclic redundancy check". This takes place in the speech encoder 11 in the same manner as it takes place today in the base station BTS.

For "Enhanced Full-Rate", important speech parameters in the speech block SPB are already today provided with parity bits according to "cyclic redundancy check", before the speech block SPB is sent from the speech encoder unit 11. However, the encoding is not preceded by sorting of the positions of the speech parameters according to importance, and aims only at error discovery during transmission through the stationary link 12. When the speech block SPB has been received in the base station BTS, the parity bits provided by the speech encoder unit 11 are removed. Instead the base station BTS re-sorts the positions of the speech parameters in the speech block SPB and supplies thereafter the parity bits CRC to the important speech parameters. The parity bits CRC supplied by the base station BTS are used for error discovery during transmission through the radio link RL.

Figure 4:
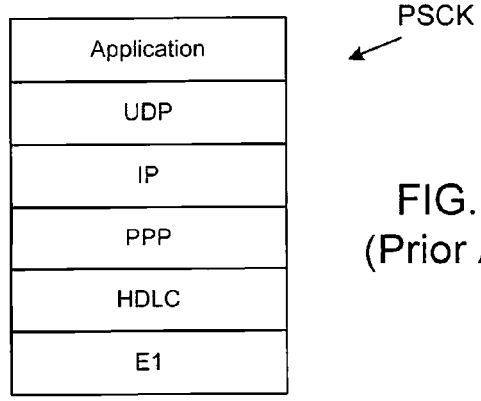
FIG. 4 shows schematically a previously known protocol stack.

FIG. 4 shows a protocol stack PSCK with different protocol layers used during the transmission between the speech encoder unit 11 and the base station BTS. In the top layer of the stack PSCK, the application resides. In this case the application is speech-encoded speech, in the form of speech blocks SPB with control information to decompress the speech. The speech-encoded speech is to be transferred by the application layer between the mobile station MS and the speech encoder unit 11.

For transferring of the application, the underlying layer UDP is used.

Under the UDP layer there is an IP layer. The IP layer handles transmission services between the two end points of the transmission chain, i.e. usually between servers and routers or between routers. Since the standardized radio link RL in GSM is not adapted to packet transmission, it is the speech encoder unit 11 and the base station BTS which forms the end points for IP. In FIG. 1b no router is shown between the speech encoder unit 11 and the base station BTS, but a router should be present in a realized network for controlling the traffic.

Under the IP layer there is a layer PPP (Point-to-Point Protocol), which is carried by a HDLC (High Level Data Link Control), and thereunder, for example a layer, SDH (Synchronous Digital Hierarchy) or PDH (Plesiochronous Digital Hierarchy), where E1 (2 048 Mbits/sec) is commonly present in mobile telephone networks. For the layers under IP, alternative protocols to the ones indicated in FIG. 4 may be used, e.g. ATM (Asynchronous Transfer Mode).

A speech block SPB, which is to be sent in a downlink from the speech encoder unit 11, is carried by a UDP message. The UDP message comprises the speech block SPB as well as a UDP header. The UDP header contains the gateway number to a receiving application in the base station BTS, i.e. the logical traffic channel using a specific time slot in the radio interface, and a sending gateway in the speech encoder unit 11. The UDP header also contains a check sum, i.e. parity bits, intended to be used for discovering any case of data being distorted during the transmission.

The IP layer wraps the UDP message in an IP packet. The IP packet comprises, apart from the UDP message, an IP header with an IP address to the base station BTS in question. By means of the IP address and the UDP gateway number, speech blocks SPB are identified, which speech blocks belong to the speech connection between the mobile station MS and the stationary telephone TLP. The IP header as well contains a check sum, but this acts on the IP header only.

The HDLC layer, i.e. the layer carrying the IP packet in a HDLC packet also provides the HDLC packet with a check sum acting on the entire HDLC packet.

Packet-oriented transmission and the protocol stack PSCK according to FIG. 4 are usually used for data transmission. Unlike speech, data is sensitive to error detection but can handle delay. At the occurrence of an error discovery with the aid of the check sum in the HDLC packet, a re-sending of the data is usually requested. The request for a short delay makes re-sending of a speech block impossible, if the check sum indicates an error.

The check sum both in the HDLC header and the UDF header may be set to zero, at which no error detection is carried out to check that the UDP message is correctly detected. According to the invention, both of the check sums are set to zero and a speech block SPB will therefore be sent to the mobile station MS even if an error occurs therein during sending from the speech encoder unit 11.

As an alternative to setting the check sum in the UDP layer to zero, a check sum is used, which only acts on the UDP header or only on the UDP header and a limited portion of the content, according to the proposal UDP Lite.

The speech encoder in the mobile station MS, as well as the speech encoder unit 11, are equipped with a function which effectively hides errors in the speech block SPB when the speech block SPB is decompressed. This function is already inserted in existing mobile stations MS.

With previously known technique it was possible to use the effective methods of the mobile station MS for processing of an erroneously detected speech block SPB only for errors that have arisen during sending through the radio link RL. Thanks to the invention, also errors that occur during the transmission through the stationary link 12 can be processed in the speech encoder of the mobile station MS.

Without the invention, and with the check sums in the HDLC packet and the UDP header set to zero, there would be no possibility to discover errors in the speech block SPB that had arisen in the stationary link 12. On the contrary, in case the check sum would be used, the entire speech block SPB would be thrown away at the occurrence of an error detection, even if the error concerns a less important speech parameter only.

The speech encoder unit 11 is included in the mobile radio networks available today, as the GSM network PLMN shown. In the third generation systems, speech encoder units 11 will not, according to proposals, be part of the stationary part of the mobile radio network. Instead there will be speech encoder units in so-called Media Gateways outside the mobile radio network.

Figure 5:
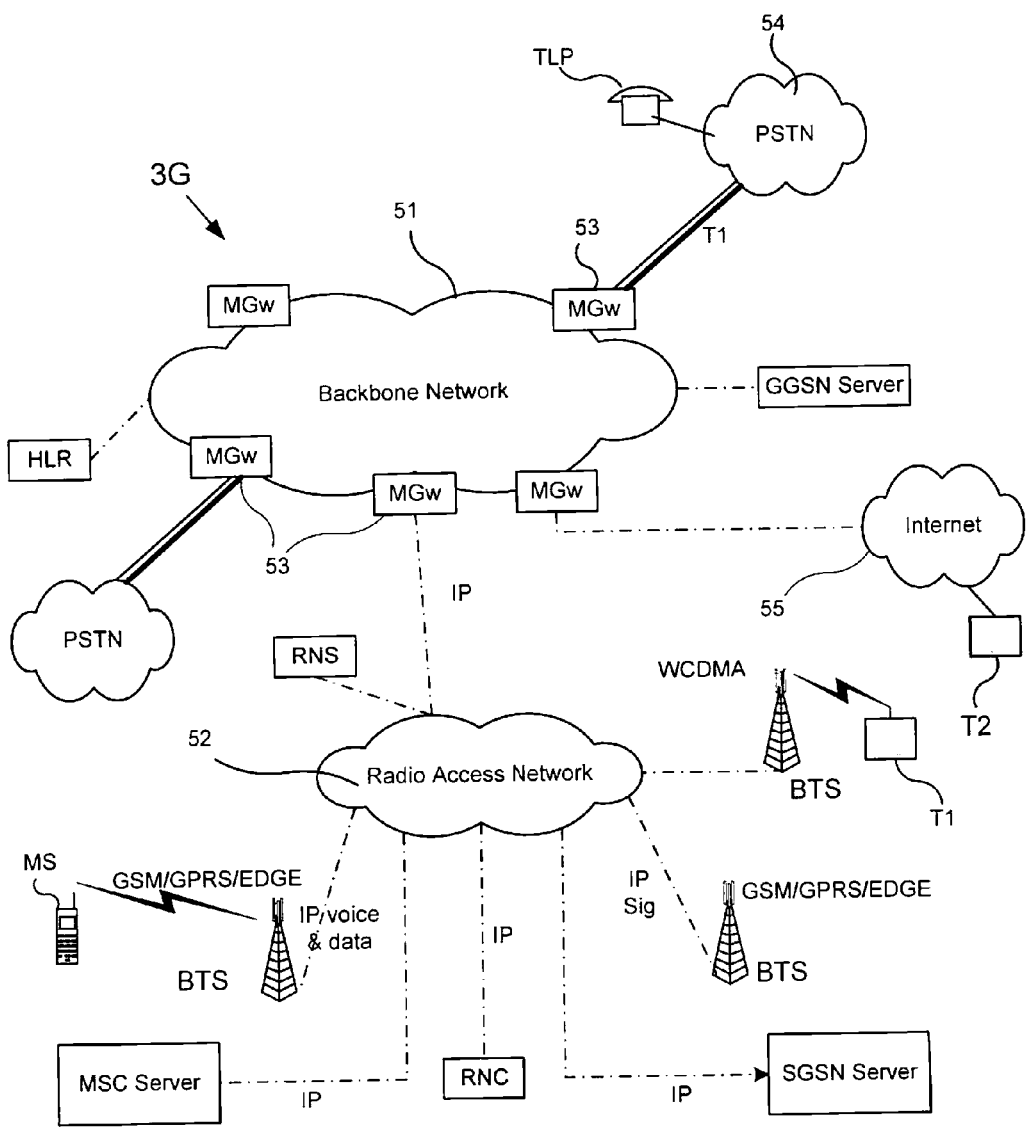
FIG. 5 shows a block diagram of a possible architecture for the third generation mobile radio network and transport network.

FIG. 5 shows a possible architecture for third generation systems 3G, where tele- and data communication has migrated. Instead of, as is the case today, dividing networks into data or tele networks, a functional division is given. A transport network 51 (Backbone Network) takes care of transport services only. Services as traditional telephoning and Internet communication are provided by separate access networks 52, 54, 55, using the transport network 51. The access networks 52, 54, 55 connect to the transport network 51 via Media Gateways 53. One of these access networks 52, 54, 55 is a radio access network 52. The radio access network 52 provides carrying services for communication with mobile stations MS through radio links RL. The radio access network 52 includes a number of radio base stations BTS. The radio base stations BTS can be adapted to different radio access techniques.

A large number of the functions built into the mobile radio networks PLMN of today are missing in the radio access network 52. Instead these functions are provided as separate services available via the transport network 51. One such function is, for example, mobility (Mobility Management), which makes it possible to route an incoming call to a certain mobile station MS, independently of where the mobile station MS is located within the covering area of the radio access network 52.

Another function which is not included in the radio access network 52 is speech encoding. Mobile stations MS, using the radio access network 52 for communication, are provided with speech encoders. The speech encoders in the stations can be of many different types. Speech encoder unit 11, corresponding to the ones built into the GSM network, are present in Media Gateways 53. At the occurrence of speech communication between a mobile station MS and a telephone TLP, connected to a telephone access network 54, an encoded compressed stream of speech is sent from the mobile station MS through a radio link RL, via the radio access network 52 and a Media Gateway 53, further via the transport network 51 to a Media Gateway 53 connected to the telephone access network 54. In this latter Media Gateway, the speech stream is decoded. The speech stream is then sent decoded, through the telephone access network PSTN, at a higher bit rate, e.g. as a PM encoded signal.

In the opposite direction, i.e. from the telephone TLP to the mobile station MS, a stream of speech is sent uncompressed through the telephone access network PSTN to the Media Gateway 53, which is connected to the transport network 51. In this Media Gateway 53, the stream of speech is compressed by encoding. The compressed stream is then sent through the transport network 51 via Media Gateway 53 through the radio access network 52 to the mobile station MS. In the mobile station, the stream of speech is decoded, upon which sound is created.

During the transport between the mobile station MS and the Media Gateway connected between the transport network 51 and the telephone access network 54, packet-oriented transmission is used. Probably the UDP layer and the IP layer shown in FIG. 4 are used but alternative protocols may be used.

The types of speech encoders used in mobile stations MS and in Media Gateways 43 will, during the speech encoding, divide the speech into short periods and create speech parameters for each period. The speech parameters are thereafter sent in speech blocks in a manner similar to that in speech encoding according to Full-Rate, Half-Rate and Enhanced-Full-Rate.

A further advantage is that many different types of speech encoders can be used in the Media Gateways 43 without the nodes involved during the transport of the speech blocks SPB having to adapt the transport to the type of speech encoding used.

For the third generation systems 3G, the invention will be more important than it is for today's mobile radio networks PLMN, since encoded speech will be sent via more nodes and thereby the risk of misinterpretation of data will increase. If an error is discovered, it is important that the error is processed by the speech encoder instead of one of the nodes handling the transport.

Additionally, not only speech but also other new real-time services will be sent compressed. Some of these, e.g. video services, will need a large band width. In order to use also the transport network 51 effectively, the information stream is compressed, e.g. by video encoding.

A duplex video connection in real-time can, for example, be established between a first terminal T1, connected to the radio access network 52, and a second terminal T2, connected to Internet 55. The terminals T1 and T2 are shown in FIG. 5. Each terminal T1, T2 is provided with video- and speech encoders and decoders. Video and speech signals are sent compressed between the two terminals T1, T2. According to the invention, the compressed speech- and video signals are provided with error-discovering encoding.

It should be noted that the invention is important even if a radio link RL is not included in the transmission chain for the compressed information.

Coding can be provided to selected speech parameters or bits, even if the positions of the encoded bits or speech parameters are not sorted according to importance. But if the positions of the bits and/or parameters are sorted, this should be done in the encoder. Thereby nodes included in the transmission chain do not have to make further resorting and the transmission is simplified.

Moreover, there is a further important reason to sort the positions of the most important bits or speech parameters in the speech block SPB. During packet-oriented transmission through the stationary link 12 and in the third generation networks 3G, overload is occasionally present. As a result of overload, delays arise and packets are thrown away.

Sorting the positions of the speech parameters or the bits in the speech block SPB makes it simpler, during overload on the link 12 or any of the links in the radio access network 52 or the transport network 51, to be able to throw away the less important speech parameters or bits and let the more important ones be sent through the link 12. This invention does not give the entire solution to throwing away less important speech parameters/bits during congestion, but sorting the speech parameters/bits is an important prerequisite for this being possible. The present invention is advantageously used in combination with an invention described in a patent application in U.S.A with application Ser. No. 09/275,069. This latter patent application gives a solution to how parts of the packet can be thrown away during overload.

By sorting the position of the bits according to importance in the speech block SPB, it is also possible to divide the speech blocks into different speech frames SPF and to let the speech frames be sent in packets with different priorities. For example, the more important bits are sent in a packet given a high priority for reaching the end point, while the less important bits are sent in another packet with lower priority for reaching the end point. Standards for QoS will make it possible to send packets with different priorities.

"Circuit-oriented" means that, out of the total transmission capacity in the link 12, there is a certain capacity per time unit reserved for each of a number of different connections. It is further assumed that the link 12 handles transmission for a number of speech connections between the base station BTS and a corresponding number of speech encoders 11.

Here "packet-oriented" refers to that the total transmission capacity in the link 12 is shared between all speech connections in progress and that the capacity is assigned to the one having something to send at the moment. The transmission of speech takes place with packets with a format defined in advance. DTX (Discontinuous Transmission) is a technique for detecting pauses in the speech and for terminating the creation of speech blocks SPB during the pauses. Therefore, with DTX, fewer speech blocks SPB are sent through the link 12, and for each speech connection, a lower transmission capacity is needed through the link 12, when viewed in a longer time period.

Here "error-discovering encoding" means that further bits, e.g. parity bits, are supplied to the information being sent, for making possible for the information to be compared with the further bits, when being received. There is a number of different types of error-discovering encoding. The most usual group is block encoding. "Cyclic redundancy check" is a part of the group block codes.

Of course, the invention is not limited to the embodiments described above and shown in the drawing; rather, it can be modified within the scope of the following patent claims.

The invention claimed is:

1. A method for transmission, in real time, of a speech block having a first bit rate containing parameters representing the data in a corresponding segment of a digitally represented data stream, comprising the steps of
   compressing said speech block in an encoder at a first node, whereby a second bit rate, being considerably lower than the first bit rate, is obtained,
   supplying error discovering encoding in the encoder at the first node, after the compression, whereby the compressed speech block obtains a third bit rate, being slightly higher than the second rate,
   sorting positions of speech parameters in said compressed speech block according to importance;
   sending the compressed speech block through a transmission chain comprising a radio link (RL) and a statistically multiplexed packet-oriented link, wherein said radio link and said packet oriented link are connected via a radio base station (BTS) in a mobile radio network (PLMN);
   decompressing the speech block at a second node, whereby the first bit rate is regained,
   comparing, at the second node, parity bits associated with said speech block for discovery of errors in the data stream, wherein at least one of the first and second nodes is part of the mobile radio network (PLMN).

2. A method according to claim 1, wherein one of the first and the second nodes is a mobile station (MS) with a connection through a radio link (RL).

3. A method according to claim 1, wherein the data stream, when being compressed, is divided into segments corresponding to time periods of a certain length, and for each segment a speech block is created, containing parameters representing the data of the segment.

4. A method according to claim 3, wherein the importance of the parameters, in relation to each other, has been graded and the position of the parameters in the data block is sorted according to importance.

5. A method according to claim 4, wherein the parameters are divided into two classes, depending upon their importance, and where the parameters in the most important class are supplied with said parity bits for error check.

6. A method according to claim 3, wherein the data stream constitutes digitally converted speech, the data block is a speech block (SPB) and the parameters are speech parameters.

7. A method according to claim 3, wherein the data stream is a digitally converted video signal.

8. A method according to claim 3, wherein the speech blocks are sent to the second node even if the speech blocks are erroneously detected during the sending.

9. A mobile radio network (PLMN) comprising
   at least one stationary speech encoder unit having a connection to a duplex pulse code modulation (PCM) link, a connection to a packet-oriented link, having means to compress a stream of speech from the PCM link and pass it on, in compressed form, as a stream of speech blocks (SPB) through the packet-oriented link, and having means to receive, from the packet-oriented link, a stream of speech blocks, means to decode the speech blocks and for forming a decompressed speech stream, being sent through the PCM link,
   at least one base station (BTS) connected to the packet-oriented link and connected to at least one radio link (RL) having means to receive a stream of speech blocks from the packet-oriented link and for passing the stream of speech blocks on through the radio link (RL), and having means to receive, a stream of speech blocks from the radio link (RL) and pass them on through the packet oriented link and
   a mobile station (MS) having
      means to receive, from the radio link (RL) the stream of speech blocks,
      means to decode the speech blocks forming a decompressed stream of speech, means to electrically register acoustic speech, means to compress the registered speech, at which the speech blocks are formed, and means to send the speech blocks through the radio link, said sending means further comprising:

means to provide, in the speech encoder unit as well as in the mobile station (MS), created speech blocks with associated parity bits, and means to compare, in the mobile station (MS) and the speech encoder unit, the content of received speech blocks with accompanying parity bits for possible error discovery, to be able to, when errors occur, hide the errors during the decoding of the received speech blocks.

* * * * *